United States Patent [19]

Forrest et al.

[11] Patent Number: 5,554,220

[45] Date of Patent: Sep. 10, 1996

[54] METHOD AND APPARATUS USING ORGANIC VAPOR PHASE DEPOSITION FOR THE GROWTH OF ORGANIC THIN FILMS WITH LARGE OPTICAL NON-LINEARITIES

[75] Inventors: Stephen R. Forrest; Vladimir S. Ban; Paul E. Burrows; Jeffrey Schwartz, all of Princeton, N.J.

[73] Assignee: The Trustees of Princeton University, Princeton, N.J.

[21] Appl. No.: 444,252

[22] Filed: May 19, 1995

[51] Int. Cl.$^6$ ................................................. C30B 29/54
[52] U.S. Cl. ........................... 117/88; 117/91; 117/99; 117/102; 117/104; 117/925; 117/926; 117/927
[58] Field of Search ..................... 117/88, 91, 99, 117/102, 104, 925, 926, 927

[56] References Cited

U.S. PATENT DOCUMENTS

| | | | |
|---|---|---|---|
| 4,684,598 | 8/1987 | Petember et al. | 430/269 |
| 4,731,756 | 3/1988 | Potember et al. | 365/153 |
| 5,139,592 | 8/1992 | Debe | 117/925 |
| 5,256,595 | 10/1993 | Flemish et al. | |
| 5,323,482 | 6/1994 | Stewart et al. | 385/141 |

FOREIGN PATENT DOCUMENTS

| | | | |
|---|---|---|---|
| 279032 | 5/1990 | Germany | 117/925 |
| 1172297 | 7/1989 | Japan | 117/925 |

OTHER PUBLICATIONS

Y. S. Ban and D. Rodefeld; J. R. Flemish and K. A. Jones, *High rate epitaxial growth of InP by merged hydride organometallic vapor phase epitaxy in a hot–wall reactor*; Appl. Phys. Lett. 62(2), 11 Jan. 1993, pp. 160–162.

Primary Examiner—Robert Kunemund
Attorney, Agent, or Firm—Watov & Kipnes

[57] ABSTRACT

In a method using organic vapor phase deposition (OCPD), for the growth of thin films of optically nonlinear organic salts, a volatile precursor of each component of the salt is carried as a vapor to a hot-wall reaction chamber by independently controlled streams of carrier gas. The components react to form a polycrystalline thin film on substrates of glass and gold. Excess reactants and reaction products are purged from the system by the carrier gas. For example, the method provides the growth of polycrystalline, optically nonlinear thin films of 4'-dimethylamino-N-methyl-4-stilbazolium tosylate (DAST) with >95% purity.

34 Claims, 6 Drawing Sheets

METHOD AND APPARATUS USING ORGANIC VAPOR PHASE DEPOSITION FOR THE GROWTH OF ORGANIC THIN FILMS WITH LARGE OPTICAL NON-LINEARITIES

GOVERNMENT RIGHTS

This invention was made with Government support under Contract No. F-30602-93-C-006 (Princeton University), awarded by the Air Force OSR, Department of Defense and a 1994 Air Force —SBIR award (Phase I) to PD-LD. The Government has certain rights in this invention.

FIELD OF THE INVENTION

The present invention relates generally to the fabrication of optical quality thin films, and more particularly to the use of organic materials in the fabrication of such thin films for application in non-linear optical devices, for example.

BACKGROUND OF THE INVENTION

There is considerable interest in organic materials with large second order hyperpolarizabilities for use in nonlinear optical (NLO) devices such as modulators and frequency doublers. To achieve a high figure of merit for such devices requires a material with a non-centrosymmetric bulk crystal structure and low dielectric constant. To this end, NLO-active chromophores are traditionally incorporated into a polymer matrix and electrically poled to achieve the necessary bulk symmetry. However, such materials are limited by their low glass transition temperatures and poor stabilities at elevated temperature.

Figure 1A:
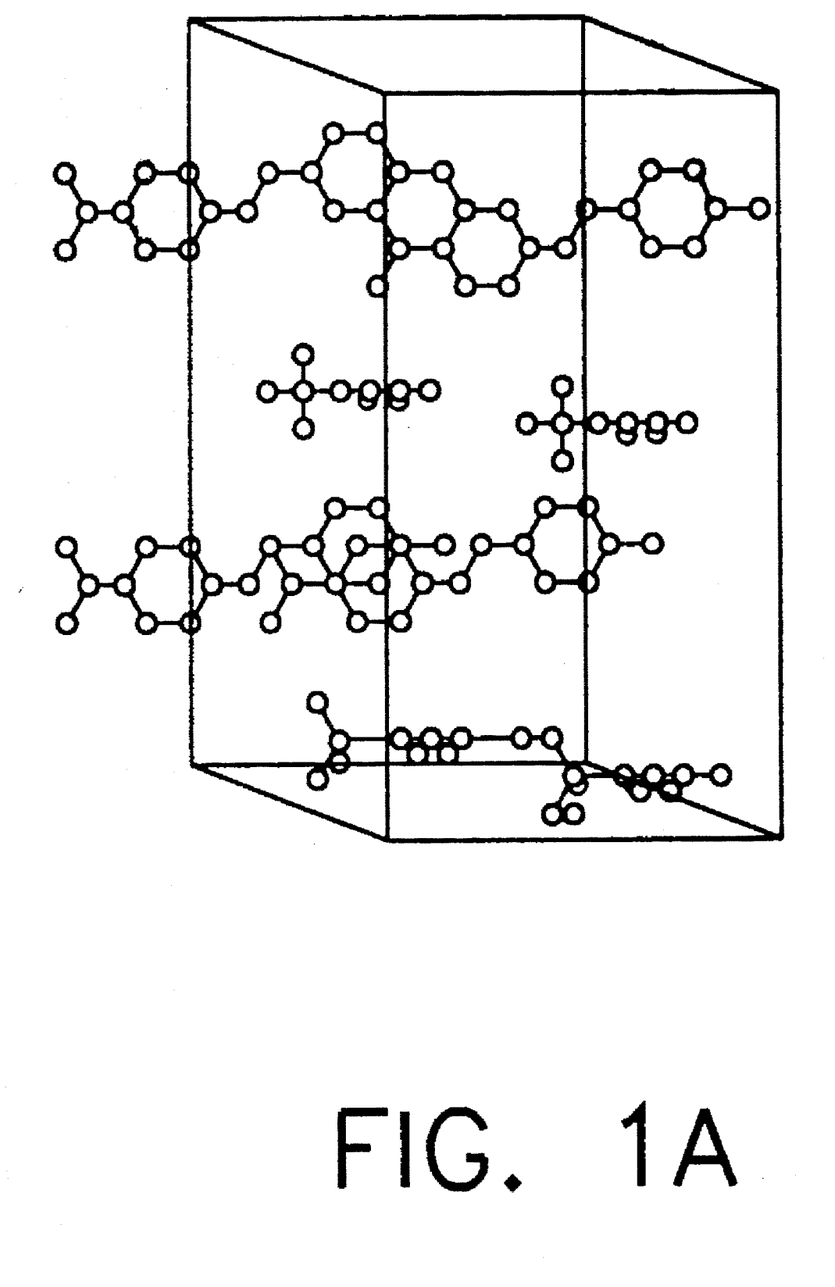
FIG. 1A shows an SHG-active DAST bulk crystal structure.

Recently, single crystals of organic and organometallic salts have been shown to possess extremely large second order ($X^{(2)}$) NLO effects leading to a high second harmonic generation (SHG) efficiency. The naturally non-centrosymmetric crystal structures of these compounds obviates the need for external poling. Furthermore, these salts have a high optical damage threshold and sufficient stability with respect to temperature to withstand many conventional semiconductor fabrication processes. In particular, highly pure single crystals of the salt 4'-dimethylamino-N-methyl-4-stilbazolium tosylate (DAST) have been shown to have a value of $X^{(2)}$ at least $10^3$ times greater than that of urea due to dipole alignment of the cation and anion constituents of the DAST structure. To illustrate this alignment, the SHG-active DAST bulk crystal structure is shown in FIG. 1A.

For many applications such as waveguide devices, it is desirable to fabricate NLO materials into optical quality thin films. Although thermal evaporation in a high vacuum environment has been used to grow thin films of many organic and inorganic materials, the technique is not always applicable to organic salts. For example, when heated in vacuum, DAST decomposes before entering the vapor phase. Attempts at double-source co-evaporation of DAST neutral precursors 4'-dimethylamino-4-stilbazole (DAS) and p-methyl tosylate (MT) to form DAST have also been unsuccessful, due in part to the radically different vapor pressures of DAS and MT, which leads to highly incongruent growth.

Vapor Phase Epitaxy (VPE) has been used to grow epitaxial thin films of many group III-V compound semiconductors, such as InP and GaAs, where there is a large difference in the vapor pressures of the group III and group V atomic constituents.

SUMMARY OF THE INVENTION

An object of the invention is to provide an organic vapor phase deposition method and apparatus, for the quasi-epitaxial growth of thin films of optically nonlinear organic salts.

With the problems of the prior art in mind, the present invention also improves and extends the techniques of conventional VPE to grow films of the NLO-active organic salt, DAST for one example, by the reaction of two volatile organic materials in a hot-wall reactor. Films formed from organic salts or compounds other than DAST may be provided through use of the present method and apparatus. In obtaining films of DAST, in one embodiment of the invention, donor and acceptor molecular precursors, namely an alkylstilbazolium salt and methyl tosylate, are placed in separate heated chambers for respective volatization. Individual streams of inert gas, such as $N_2$, are used to carry the volatized precursors into the reaction zone of a hot reactor tube serving as a growth vessel. Heating of the alkylstilbazolium halide precursor causes demethylation, rapid and irreversible loss of methyl halide by evacuation, and volatization of the neutral stilbazole. In a reaction zone of the reactor tube, the volatized precursors form DAST by in situ methylation of the stilbazole by the methyl tosylate. Note that DAST, as presented herein in conjunction with the present method and apparatus, is not meant to be limiting, and is given herein for purposes of illustration. As indicated, the invention is applicable for providing at least two component (e.g. DASM) ionic and charge transfer (e.g. TTF-TCNQ) films of other organic and organometallic salts.

BRIEF DESCRIPTION OF THE DRAWINGS

Various embodiments of the present invention are described and illustrated with reference to the accompanying drawings, in which like items are indicated by the same reference designation, wherein.

DETAILED DESCRIPTION OF THE INVENTION

Figure 1B:
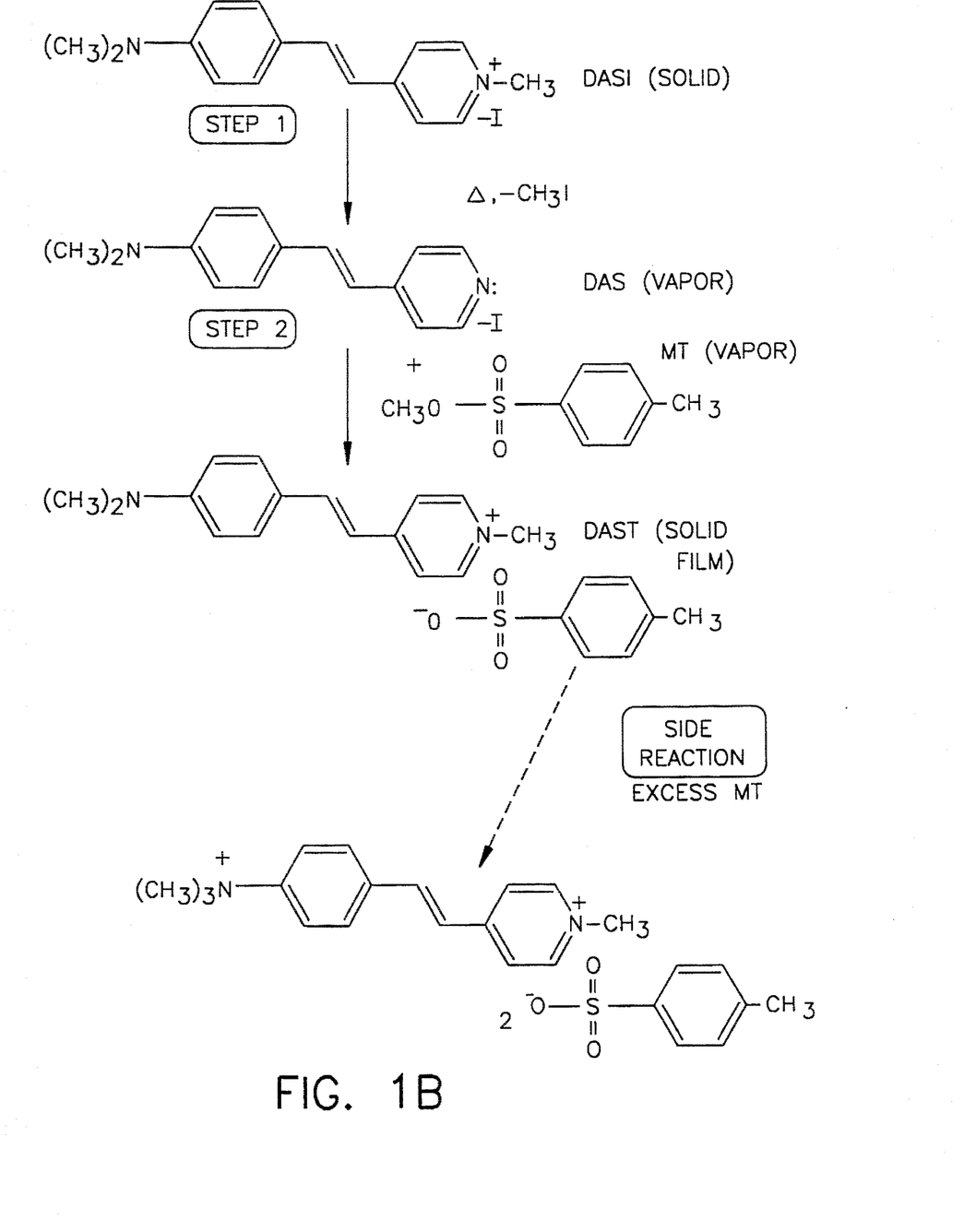
FIG. 1B shows for one embodiment of the invention a reaction scheme for the preparation of DAST by organic vapor phase deposition (OVPD)

One embodiment of the invention for the preparation of two component organic salts or charge-transfer complexes, such as dimethylamino-N-methyl-4-stilbazolium tosylate (DAST) by organic vapor phase deposition (OVPD) is shown in FIG. 1B. In step 1 of this example, thermal demethylation of 4'-dimethylamino-N-methyl- 4-stilbazolium iodide (DASI) gives neutral DAS with the elimination of volatile $CH_3I$. In step 2, the DAS reacts with methyl tosylate (MT), resulting in methylation of the pyridine ring at the nitrogen atom. The resulting positively charged stilbazolium and negatively charged tosylate ions form DAST crystals. Note that the invention is not meant to be limited to two component organic salts, such as DAST, and can be applied for use in other embodiments for preparing films from other two component organic salts and charge-transfer completes, or from three or more component organic compounds and mixtures.

Figure 2:
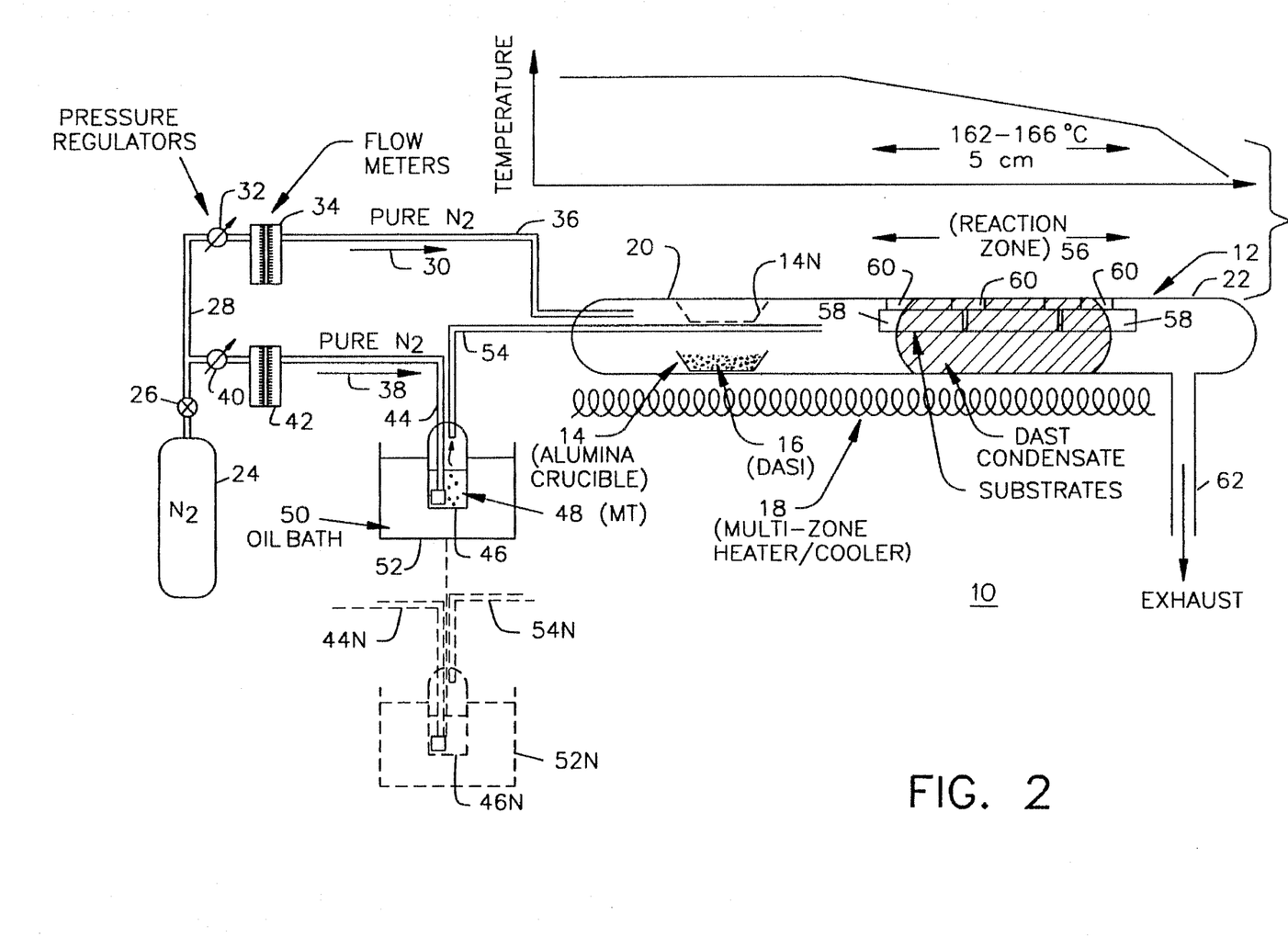
FIG. 2 shows a schematic of an OVPD reactor for one embodiment of the invention.

An OVPD reactor 10 designed to grow DAST by the above method is shown schematically in FIG. 2. The reactor tube 12 is a glass cylinder of diameter 2.5 cm and length 45 cm, in this example. A 2.5 $cm^3$ alumina crucible 14 is filled with approximately 1 g of DASI 16 and placed approximately 15 cm into one end 20 of the reactor tube 12, for example. The crucible 14 can be heated or cooled by means of one zone of a multi-zone heater/cooler 18 wrapped around the reactor tube 12. A regulated stream of pure $N_2$ gas is introduced into the hot end 20 of the tube 12 to provide a slight pressure gradient, causing the DAS vapor to flow along the reactor tube 12 toward its other end 22. The temperature of the reactor 10 is monitored by a chromel-alumel thermocouple junction (not shown) inserted into a thin-walled glass tube which runs the length of the reactor 10. Note that the dimensions illustrated herein were obtained from experimental apparatus. In practical commercial systems incorporating the present invention substantially larger diameter tubes, larger volume samples, sources, and so forth, will be required. Also, in applications of the invention with organic salts other than DAST, the multi-zone heater/cooler 18 may be used for cooling the reaction zone 56, rather than heating reaction zone 56.

A tank 24 of pure nitrogen delivers $N_2$ through a regulator valve 26 into piping 28 for delivery through two flow paths, 30 and 38, into reactor tube 12. One flow path 30 includes a series connected pressure regulator 32 and flow meter 34 from which pure $N_2$ is delivered via glass tubing 36 into a front portion of end 20 of reactor tube 12. Note that other suitable inert gases, such as argon can be used in place of nitrogen. The second flow path 38 includes a series connected pressure regulator 40 and flow meter 42 from which pure $N_2$ flows via glass tubing 44 into a bubbler 46 containing MT 48. The bubbler 46 is partially immersed in a silicone oil bath 50 within a container 52. The $N_2$ gas bubbles through the MT 48 into an end of glass tubing 54 for delivery therethrough with MT vapor to exit from the other end of tubing 54 positioned through end 20 to a position within reactor tube 12 extending beyond crucible 14 to about the center of reactor tube 12, for example. Note that in this example, since the MT 48 has a high vapor pressure, less $N_2$ will be required than from a precursor having a lower vapor pressure.

More specifically, in one embodiment of the invention, MT 48 is loaded into a 30 $cm^3$ bubbler 46, the temperature of which is maintained by the silicone oil bath 50. Pure nitrogen gas, regulated to 5 psi by regulator 40, passes through flow meter 42 and bubbles through the MT 48, thereby carrying MT vapor through glass transfer tube 54 (heated to >100° C. along its entire length) into the reactor tube 12, approximately 5 cm beyond the DASI 16 in crucible 14 (to prevent reactions between the MT vapor and DASI 16 in the crucible 14). In this example, the reaction zone 56 is about 5 cm long. The DAS vapor mixes with the MT vapor in the reaction zone 56, along which a temperature gradient of 162° C.–166° C. is maintained, and reacts to form a solid film of DAST on substrates 58 supported on thermally insulating standoffs 60 along the length of the tube 12, in this example. Excess unreacted MT vapor, and any volatile side-reaction products, are exhausted from exhaust tube 62 at the cold end 22 of the reactor tube 12. Note that the vapors exhausted from exhaust tube 62 go through a scrubber (not shown).

The growth of a reddish-brown reaction product under various conditions has been observed by the inventors. In this example, the highest yield of pure DAST is obtained at temperatures between 162° C.–166° C. in the reaction zone 56, with the DASI crucible 14 at 253° C.±5° C., and the MT bubbler 46 at 65° C. The MT vapor/$N_2$ from bubbler 46 flows into tubing 54 at 15 $cm^3$/min. The $N_2$ purge gas in tubing 36 is flowing at 400 $cm^3$/min into reactor tube 12. Note that other conditions for providing the illustrative DAST film are possible than those given herein. Optical micrographs of DAST films grown by OVPD under these conditions on various substrates were made. On gold-coated glass slides, regions of crystalline film growth with a clear alignment direction were observed, and illustrated by light and dark areas in a polarized-light micrograph. The mean film thickness was estimated by interference microscopy to be 500 nm after 3 hours of growth, giving a growth rate of 0.5 Å/s, although the film is highly non-uniform in both thickness and coverage. Regions of lower coverage displayed dendritic crystal growth, indicating a high surface mobility of the deposited molecules. Hence, it is expected that dendritic growth is characteristic of growth in regions of the reactor 10 which are at excessively high temperatures. Growth on glass, however, yielded separated islands of material, implying that the DAST film does not wet glass. It is apparent from these observations that surface interactions greatly influence the film nucleation, as is typical in comparable inorganic crystalline growth techniques. Optical quality thin films are achievable by derivitizing the substrate surface to provide more favorable physical interactions between the DAST film and the substrate 58, or by using surface crystallinity to induce templating of the first deposited layer in a "quasi-epitaxial" growth mode.

Figure 3A:
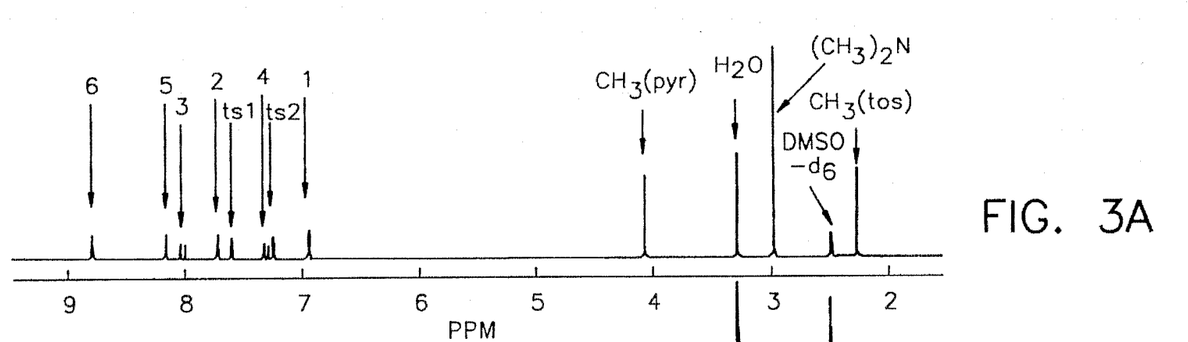
FIG. 3A shows an NMR spectrum for pure DAST.
Figures 3B, 3C:
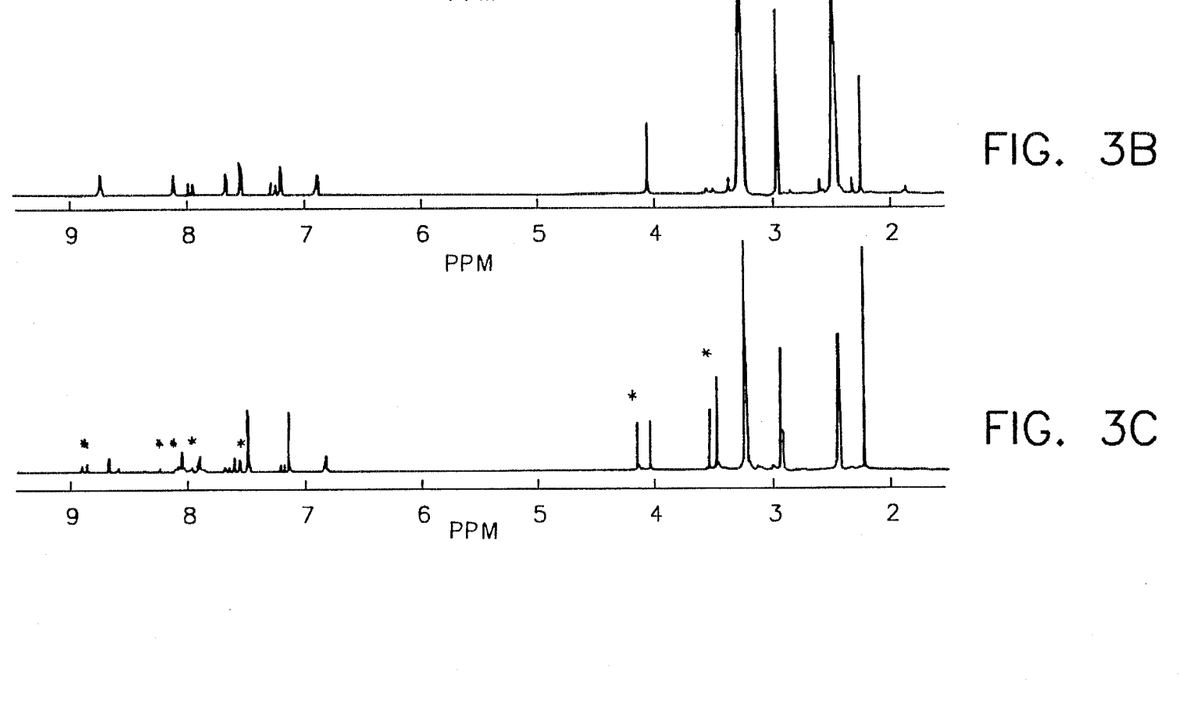
FIG. 3B shows an NMR spectrum for a DAST film sample grown under optimum conditions via one embodiment of the invention.
FIG. 3C shows an NMR spectrum for a film sample grown under less than optimum conditions.

Confirmation of the stoichiometric composition of the reaction products was accomplished by one dimensional (1D) and two dimensional (2D) $^1H$ NMR (nuclear magnetic resonance) spectroscopic analysis of OVPD films dissolved in dimethyl sulfoxide-$d_6$ (DMSO-$d_6$). The $^1H$ NMR spectrum of pure DAST (see FIG. 3A) was assigned based on standard electron density arguments, and these assignments were supported by observation of appropriate cross-peaks in the 2D spectrum. NMR analysis (4000 scans) of a film sample grown under the optimum conditions described above (see FIG. 3B) shows all of the peaks assigned to DAST, with no detectable impurities in the aromatic region. Based on the limits of sensitivity and integration accuracy of NMR measurement, the DAST film is >95% pure. These results provide clear evidence that pure DAST can be grown by the OVPD method and apparatus of the present invention. Methylation of the neutral stilbazole (DAS) could take place at either the pyridine or dimethylamino group nitrogens. The lone pair of the dimethylamino group nitrogen is $sp^3$ hybridized, and that of the pyridine is $sp^2$. Apparently, methylation is at least kinetically favored at the pyridine, suggesting steric hindrance might exist at the dimethylamino group.

The amount of each precursor entering reactor tube 12 is accurately controlled by controlling the temperature and flow rate of the $N_2$ carrier gas, in this example. The present OVPD method provides precise metering of the precursors or reactants independently of their vapor pressure or chemical nature. With the present method one can combine chemicals with widely different characteristics in ratios proper for the desired film. This method makes possible the deposition of a DAST film, which is difficult or impossible to prepare by sublimation under vacuum, due to the very large discrepancy in the vapor pressure of its precursors.

The hot wall reactor 10 of FIG. 2 can be expanded as shown to include to a practical limit up to n (where n=1, 2, 3, 4, 5, . . . ) bubblers 46N (shown in phantom) with respective oil bath containers 52N, nitrogen delivery tubes 44N, and precursor output tubes 54N to feed the associated volatized precursor into reactor 10, for handling up to n precursors. Similarly to a practical limit up to n crucibles 14N (shown in phantom) can be vertically stacked on shelves in reactor tube 12 for processing up to n precursors. The crucibles 14N would be stacked on vertically aligned shelves (not shown). In other words, as shown, the hot wall reactor system 10 can be expanded to include a plurality of bubblers 46, and/or crucibles 14, in any desired combination, for processing a plurality of precursors.

Figure 4:
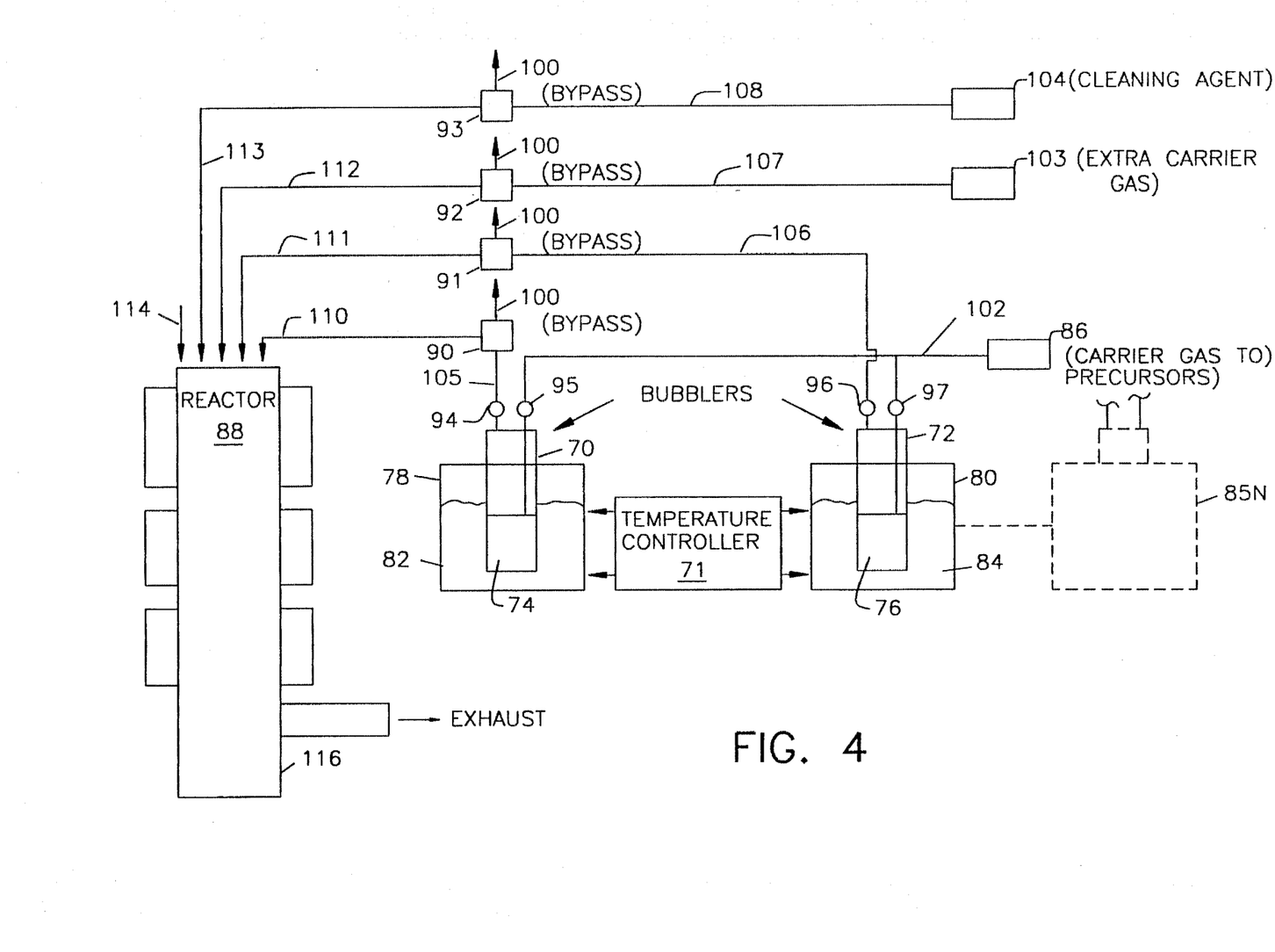
FIG. 4 shows a simplified pictorial diagram of an OVPD precursor inlet system for one embodiment of the invention.

In another embodiment, precursor streams can be turned on and off almost instantly, by employing the so-called quick switching valves 90–97 (see FIG. 4). These valves 90–97 can direct the precursor stream into the reactor 12 or into a by-pass line 100, so that at a given time different precursor streams may be entering the reactor 12 and thus deposit films of different composition and characteristics. This feature can be used in the formation of quantum well-like structures of organic films. With currently existing electronically controlled switching valves, monomolecular layer control is feasible.

Another embodiment for the present OVPD is the possibility of installing several bubblers 46, so that several precursor streams enter the reactor 12 simultaneously, to synthesize films in situ. As indicated below, for certain precursors, such as methyl trifluoroacetate, MAr, the associated bubbler 46 is cooled instead of heated, for providing vapor of MAr to react with volatized DAS in an associated reaction zone. For a given bubbler 46 the associated oil bath 50, in this example, may be heated or cooled depending upon the particular precursor contained within the bubbler 46.

The critical dependence of product composition on reaction parameters was revealed by NMR analysis (see FIG. 3C) of a film grown under slightly different conditions. This film sample also exhibits all of the peaks assigned to the DAST structure. However, there are additional peaks present which are indicative of an impurity for which downfield shifts relative to DAST for aromatic, vinylic and methyl protons were recorded. Assignment of these peaks was supported by 2D NMR and compared proton-by-proton with analogous assignments for DAST. These downfield shifts are consistent with loss of the free electron pair of the $-N(CH_3)_2$ group, perhaps by methylation at that site to give a dimethylated dicationic DAST analog (see FIG. 1B). If the DAST film in the reactor tube 12 is exposed to an excess of hot MT vapor, methylation of the $-N(CH_3)_2$ group could occur at the solid film-vapor interface. Confirmation of the assignment of the impurity in vapor phase synthesized films of DAST as dimethylated DAS ditosylate was obtained by treating a solution of DAST at reflux in methanol with an excess of MT, removal of solvent under reduced pressure, and $^1H$ NMR analysis of the resulting solid.

Having demonstrated the chemical purity of the OVPD DAST films using $^1H$ NMR, SHG intensity measurements were employed to qualitatively determine the degree to which the noncentrosymmetric crystal structure of DAST (see FIG. 1A) is achieved. To measure the SHG efficiency of the films, a 1.06 μm wavelength Nd:YAG laser beam was passed though an $H_2$ Ramanshifter to obtain an excitation wavelength of 1.9 μm. The frequency doubled light is then at 0.95 μm, and both the fundamental and the SHG signal are beyond the absorption band of DAST. The SHG intensity at 0.95 μm of the film was found to be approximately 10% of the intensity obtained from a "bulk" DAST powder sample. Given the fact that the film was very thin and discontinuous (resulting in a poor coupling and no phase match to the excitation source), this result qualitatively indicates a surprisingly high SHG efficiency; possibly comparable to bulk DAST. Hence, these optical measurements provide strong evidence that thin films of the SHG-active phase of DAST have been grown with excellent structural and chemical purity.

In another embodiment of the invention, FIG. 4 shows an OVPD precursor inlet system in a simple schematic. The various components shown will now be described, many of which are the same as for the first embodiment of the invention.

Bubblers 70, 72 containing precursors:

Bubblers 70 and 72 are included for containing precursors, in this example, the neutral molecular precursors of DAST, methyl tosylate 74 and alkylstilbazolium iodide 76, respectively. The bubblers 70 and 72 are placed into containers 78, 80 and immersed in temperature controlled baths 82, 84, respectively, which can be maintained at anywhere from 77K (liquid nitrogen), to 500K (oil bath). In this manner, substances with widely different vapor pressures can be handled, as opposed to molecular beam epitaxy (MBE) or vacuum evaporation methods, where it is difficult to control the deposition of highly volatile substances. A carrier gas 86 bubbles through reactant liquids 74 and 76, and carries respective vapors into the reactor 88. The amount of vapors so transported is proportional to the vapor pressure of the precursor 74, 76 and the flow rate of the carrier gas 86. A controller 71 controls the temperature of baths 82 and 84.

The important aspect of this growth process is that by controlling the temperatures of baths 82 and 84, and flow of the carrier gas 86 to the respective bubblers 70 and 72, one can precisely control amounts of stilbazole 76 (e.g. precursor 2) and methyl tosylate 74 (e.g. precursor 1) entering the epitaxial reactor 88 to form an epitaxial deposit of the two (or more) component growth product, DAST, in this example.

Other examples of organic salts for producing thin films on substrates using the apparatus and methods of the present invention will now be given. In one example, the acceptor molecular precursor consists of methyl methanesulfonate, MM, and the donor molecular precursor consists of DASI, whereby the DASI is volatized into DAS in the associated volatization step, and in the mixing step in the associated reaction zone DAS reacts with the volatized MM to form 4'-dimethylamino-4-methylstilbazolium methanesulfonate (DASM) crystals on the associated substrate.

In another example, the acceptor molecular precursor consists of methyl trifluoromethanesulfonate, $M_fM$, and the donor molecular precursor consists of DASI, whereby the DASI is volatized into DAS in the associated volatization step, and in the mixing step the DAS reacts with the volatized to form 4'-dimethylamino- 4-methylstilbazolium trifluoromethanesulfonate ($DASM_f$) crystals on the associated substrate.

In another example, the acceptor molecular precursor consists of MT, and the donor molecular precursor consists of 4'-dimethylamino- 4-methylstilbazolium thiophenoxide, DASTh, whereby the DASTh is volatized into DAS in the associated volatization step, and in the mixing step the DAS reacts in the associated reaction zone with the volatized MT to form 4'-dimethylamino-4-methystilbazolium tosylate (DAST) crystals on the associated substrate.

In another example, the acceptor molecular precursor consists of MT, and the donor molecular precursor consists of 4'-methoxy- 4-methylstilbazolium thiophenoxide, MeOSI, whereby the MeOSI is volatized into 4'-methoxy-4-methylstilbazole (MeOS) in the associated volatization step, and in the mixing step the MeOS reacts with the volatized MT in the associated reaction zone to form MeOST crystals on the associated substrate.

In another example, the acceptor molecular precursor consists of MT, and the donor molecular precursor consists of 4'-dimethylamino- 4-ethylstilbazolium iodide, DAS(Et)I, whereby the DAS(Et)I is volatized into DAS in the associated volatization step, and in the mixing step the DAS reacts in the association reaction zone with the volatized MT to form DAST crystals on the associated substrate.

In another example, the acceptor molecular precursor consists of MT, and the donor molecular precursor consists of 4'-dimethylamino- 4-ethylstilbazolium hydroxide, DAS(Et)OH, whereby the DAS(Et)OH is volatized into DAS in the associated volatization step, and in the mixing step the DAS reacts in the associated reaction zone with the volatized MT to form DAST crystals on the associated substrate.

In another example, the acceptor molecular precursor consists of acetyl toluenesulfonate, AT, and the donor molecular precursor consists of DASI, whereby the DASI is volatized into DAS in the associated volatization step, and in the mixing step the DAS reacts in the associated reaction zone with the volatized AT to form 4'-dimethylamino-4-acetylstilbazolium tosylate (DAAST) crystals on the associated substrate.

In yet another example, the acceptor molecular precursor consists of methyl trifluoroacetate, $MA_f$, which is introduced through a bubbler which is cooled, and the donor molecular precursor consists of DASI, whereby the DASI is volatized into DAS in the associated volatization step, and in the mixing step the DAS reacts in the associated reaction zone with the volatized $MA_f$ to form 4'-dimethylamino-4-methylstilbazolium trifluoroacetate ($DASA_f$) crystals on the associated substrate.

In another example, the precursors consist of TTF-TCNQ, and charge-transfer complexes.

In another example, the precursors consist of organic mixtures for achieving properties optimal for two different molecules (e.g. R+G+B precursors to get white light).

In summary, the acceptor molecular precursor can be either one of an oxidizing agent, or an electrophile, or an acid, respectively. The donor molecular precursor can be either one of a reducing agent, or a nucleophile, or a base, respectively.

Quick switching valves 90–97:

Valves 90–97 are also crucial components of the OVPD inlet system. They regulate the admittance of the carrier gas 86 into bubblers 70 and 72, and direct the vapor-saturated stream either directly into the reactor 88 or into bypass lines 100. This feature is important because it allows one to quickly change the reactant streams entering the reactor 88, for changing the nature and the composition of the growth films. This is important when quantum wells or other thin film structures are desirable. It can be also applicable to the molecular layer epitaxy, (MLE), of organic materials, where films grow molecular layer by molecular layer.

Inlet lines:

Inlet lines 105–108 introduce reactants into the reactor 88 or to the by-pass lines 100. Extra inlet lines can be connected to provide additional amounts of carrier gas to achieve the appropriate dilution when necessary and thus regulate partial pressure of precursors. In this example, the four inlet lines 105–108 provide methyl tosylate, stilbazole, extra carrier gas 103, and a cleaning agent 104 for the elimination of the toxic residue of the process, respectively.

Figure 5:
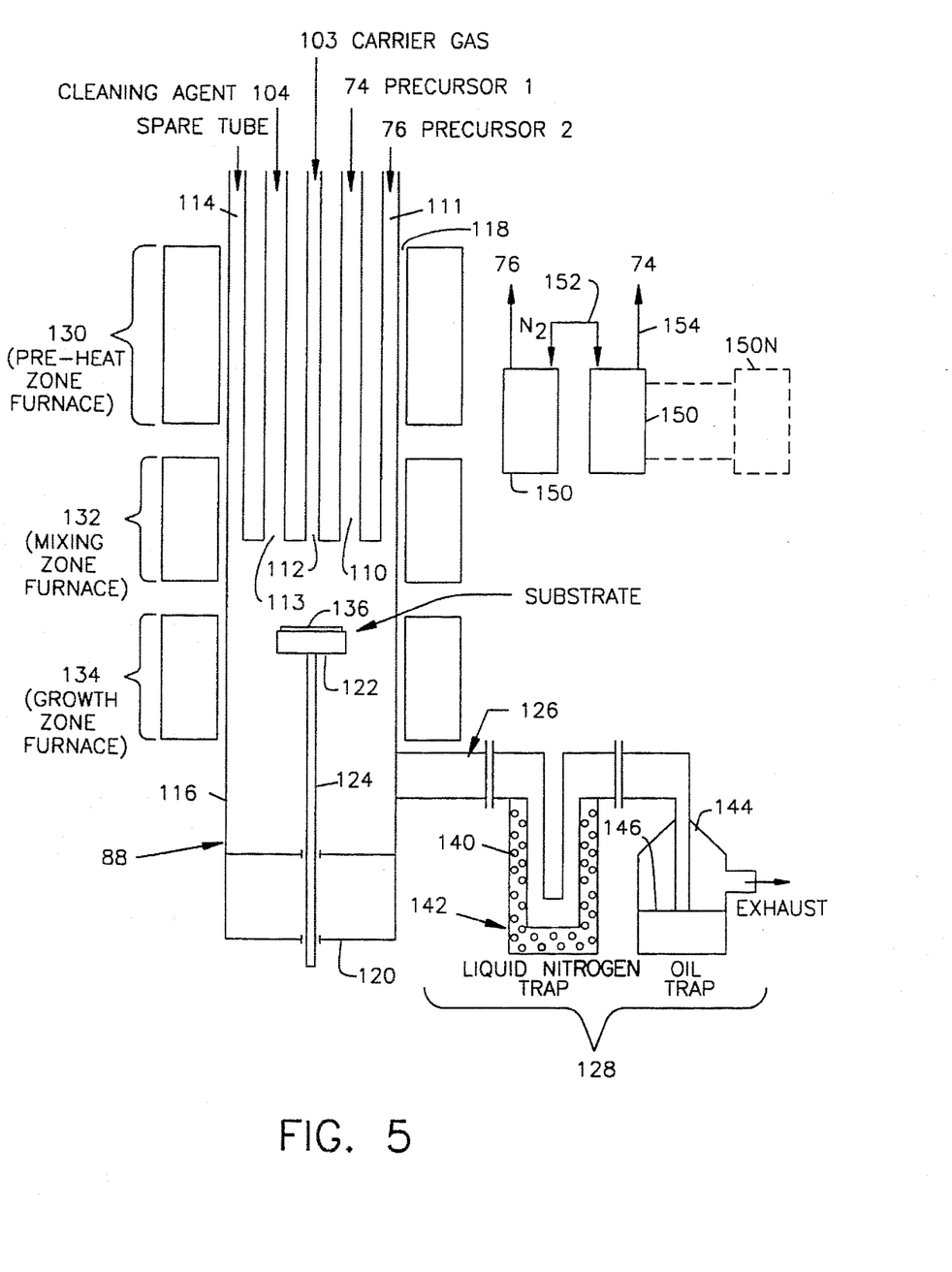
FIG. 5 shows a simplified pictorial diagram of an OVPD reactor for an embodiment of the invention.

Design of the reactor 88:

The reactor 88 is simple, low cost, and flexible in terms of geometry, flow rates and temperature zones. In this example, reactor 88 is shown schematically in FIG. 5. It typically consists of five one-quarter inch diameter inlet tubes 110–114 which are connected to one end 118 of a three inch diameter reactor tube 116. Two of the inlet tubes 111 and 110 bring to the reactor the stilbazole and the methyl tosylate components, respectively, of DAST, while the other two inlet tubes 112 and 113 are for the extra carrier gas 103 and a cleaning reagent 104, respectively. The remaining tube 114 is a spare.

The reactor tube 88 has a loading chamber on the opposite end 120, through which a substrate holder 122 can be introduced on a support rod 124. The side arm 126 of the reactor tube 88, provides independent control of the temperature of substrate 136. Also, note that side arm 126 is connected to the exhaust system 128, the function of which is to trap the exiting vapors and to isolate the growth chamber from the atmosphere.

The glass reactor 88 is placed into a 3 zone furnace, equipped with adequate temperature controllers. The function of the first zone 130 is to preheat reactants (if necessary). In the second, mixing zone 132, the temperature is adjusted to prevent the gas phase reaction between the reactants which mix here. In the growth zone 134 the temperature of the substrate is adjusted to allow the growth on the substrate 136 at a satisfactory rate with good crystalline quality. The substrate 136 is placed onto pedestal 122, which may be rotated and independently thermally controlled to enhance the thickness uniformity and growth rate of the grown film. To a practical limit, the system for reactor 88 can be expanded to include up to n (n is an integer number 3, 4, 5, 6, . . . ) bubblers 85B shown in phantom, for processing up to n precursors, for different organic molecular combinations, respectively.

Optimization of epitaxial growth:

The optimization of OVPD consists in finding parameters under which satisfactory organic eqitaxial films can be grown. These parameters are also discussed above for the first embodiment of the invention.

Partial pressures of precursors:

In organometallic vapor phase epitaxy (OMVPE) of semiconductors partial pressures of reactants are typically from 0.001 to 0.01 Torr. The partial pressures of organic precursors are maintained in the same range for the present method of the invention, by regulating temperatures of the respective bubblers 70 and 72, for example, and flow rates of the carrier gases. However, it is quite possible that growth of different organic films may require individualized and considerably different input pressures.

Carrier gas flow rates:

The flow rate of extra carrier gas 103 is important for two reasons. First, it regulates partial pressures of reactants by dilution, and secondly, it determines the nature of the flow in the reactor 88. In the simplest cases, flow can be either turbulent or laminar, and these factors greatly influence heat, momentum and material transport in the reactor 88, and, consequently the rate and the nature of epitaxial growth. Actual flow rates are given above in the first embodiment of the invention.

Temperature:

Actual temperatures are given above in the first embodiment of the invention. The temperatures for different precursors are typically experimentally determined. The temperature of the first preheat zone 130 should be such that neither the condensation nor thermal decomposition of the precursor occurs. In view of large differences in vapor pressures and thermal stability of various organic compounds, it is difficult to predict the temperature of this zone.

The second, or mixing zone 132 should be maintained at temperatures where neither thermal decomposition nor excessive gas phase reaction occurs. This is determined experimentally. It is entirely possible that cooling rather than heating will be preferable in growth of some films. In this case a cooling jacket, rather than a furnace can be placed around the reactor. Alternatively, the substrate 136 itself can be cooled by injecting coolant through its support shaft 124.

The temperature of the third, or the growth zone 134, should be adjusted to a level where growth takes place and a proper balance between the nucleation and the growth exists, so that single crystal, or at least, large grained film is produced. These conditions are determined experimentally.

Handling of the exhaust:

Some of substances used in the present invention may be toxic or flammable and cannot be released untreated into the atmosphere. As FIG. 5 shows, the exiting vapors 140 are first trapped in a liquid nitrogen filled cold trap 142 and the remaining carrier gas is bubbled through a trap 144 filled with a neutral, fluorocarbon oil layer 146, which serves as a barrier to the atmosphere. If necessary, a burn box might be fitted to the exhaust to assure the complete elimination of problematic substances.

Summary:

In summary, the present invention provides a new method or process, OVPD, for the growth of extremely pure, strongly nonlinear optical (NLO)-active films of DAST via the chemical reaction of two organic vapors in a unique hot-wall reactor 12 apparatus. By using different reactants, with appropriate combinations of bubblers and solid-sources, the present inventive technique can be applied to yield thin films of many different highly polar, NLO-active organic and organometallic salts, regardless of the high vapor pressures of the materials involved. Growth of such organic compounds has not previously been possible by established methods of thin film growth. It is expected that the present inventive method will provide an entirely new range of materials and numerous novel photonic device applications, for example. The present process and apparatus is expected to provide also for growth on very large substrates of films of organic C-T salts. The substrate material includes semiconductor wafers, glass, and polymer sheets, for example. Also, the present invention provides for safe handling of toxic materials encountered in producing thin films for NLO applications.

The present invention, as shown above, methodology enables OVPD synthesis of the ionic, NLO material DAST (4'-dimethylamino- 4-methylstilbazolium tosylate), which proceeds by thermally demethylating a simple precursor to give a volatile species, 4'-dimethylaminostilbazole, which can be caused to react with a methylating agent, methyl tosylate, to give crystalline DAST with high stoichiometric purity and which displays good SHG effects. One aspect of the power of this novel OVPD method for synthesis of ionic crystals is that enormous variation in the structure of products should be possible: through OVPD, a broad range of DAST-like, crystalline materials should be accessible. Many of the variants described might not be accessible through conventional solution based methods because of solubility or reagent stability problems.

DAST owes its dramatic NLO properties to the high degree of polarization of the stilbazolium cation and to the noncentrosymmetric crystallographic orientation afforded the stilbazolium units by interaction with the tosylate counterion. (1) Changes in donor group substituent at the 4'-position expand the repertory of DAST-like materials and involve initial synthesis of stilbazole analogs by replacement of the $NMe_2$ group with, for example, OH, OMe, other dialklamino, or disilylamino groups. See Marder, S. R., et al., *Nonlinear Optical Properties of Organic Materials II*, SPIE Vol. 1147 (1987). (2) Changes in substituent at pyridinium nitrogen should affect the polarization of the stilbazolium moiety and can be accomplished through variation in the OVPD alkylating agent. These modifications can include steric choice of alkyl substituents, or acyl or other electron withdrawing group substitution. (3) Changes in the stilbazolium counterion can be made by replacing tosylate by $CH_3SO_3$; $CF_3SO_3$; or substituted benzenesulfonates, other than tosylate, and will enable ion pairing and spatial considerations to be elucidated. Id. (4) Currently, DAS is produced by demethylation of DASI by iodide. By variation in the nucleophile (for example, using the thiophenoxide salt in place of the iodide), it might be possible to liberate volatile DAS precursors under thermally milder conditions than is now possible (and, iodides might be unstable with regard to adventitious oxidation to iodine). (5) Modification of the 4-(pyridinium) alkyl substituent, for example by replacement of the methyl group by an ethyl group in the DAS precursor, enables a second pathway for DAS liberation, β-deprotonation, which might operate under thermally milder conditions than does dealkylation by nucleophilic attack. These last two modifications, while not yielding new materials, could enable product syntheses with higher stoichiometric purity than is now possible.

Although various embodiments of the invention are shown and described herein, they are not meant to be limiting, for example, those of skill in the art may recognize certain modifications to these embodiments, which modifications are meant to be covered by the spirit and scope of the appended claims. For example, many different reactor system designs other than shown can be used to perform the method of the invention, such as vertical or horizontal including internal graphite susceptors.

What is claimed is:

1. A method for growing optically nonlinear thin films of a desired organic salt on a substrate positioned in a reaction zone of a reactor, comprising the steps of:

volatizing at least one donor molecular precursor of the desired organic salt in an individual chamber, said donor molecular precursor being selected from the group consisting of a reducing agent, a nucleophile, and a base, respectively;

volatizing at least one acceptor molecular precursor of said desired organic salt in an individual chamber, said acceptor precursor being selected from the group consisting of an oxidizing agent, an electrophile, or an acid, respectively;

transporting the volatized donor and acceptor molecular precursors into said reaction zone of said reactor; and reacting said volatized donor and acceptor molecular precursors in a manner causing the growth of the desired thin film on said substrate.

2. The method of claim 1, wherein the two successive transporting steps each include using an inert gas to carry the respective volatized precursor into the reaction zone of said reactor.

3. The method of claim 2, wherein the inert gas consists of nitrogen ($N_2$).

4. The method of claim 2, wherein the inert gas consists of argon.

5. The method of claim 1, wherein said joining step further includes the step of controlling the temperature of said reaction zone of said reactor to maintain a temperature therein for optimizing the characteristics of the thin film formed on said substrate.

6. The method of claim 2, wherein said mixing step further includes controlling the flow rates of said inert gas in each of the two successive transporting steps, for partially controlling the amount of each said precursor available in said reaction zone of said reactor for growing said thin film.

7. The method of claim 2, wherein said mixing step further includes controlling the temperature of said chambers of the successively volatizing steps for partially controlling the amount of each respective said precursor available in said reaction zone of said reactor for growing said thin film.

8. The method of claim 6, where said mixing step further includes controlling the temperature of said chambers of the successively volatizing steps for partially controlling the amount of each respective said precursor available in said reaction zone of said reactor for growing said thin film.

9. The method of claim 1, wherein said mixing step further includes the step of rotating said substrate to enhance the thickness uniformity of the film grown thereon.

10. The method of claim 1, wherein said acceptor molecular precursor consists of MT, and said donor molecular precursor consists of DASI, whereby said DASI is volatized into DAS in the associated volatization step, and in said mixing step the DAS reacts with the volatized MT to form DAST crystals on said substrate.

11. The method of claim 1, wherein said acceptor molecular precursor consists of methyl methanesulfonate, MM, and said donor molecular precursor consists of DASI, whereby said DASI is volatized into DAS in the associated volatization step, and in said mixing step the DAS reacts with the volatized to form 4'-dimethylamino- 4-methylstilbazolium methanesulfonate (DASM) crystals on said substrate.

12. The method of claim 1, wherein said acceptor molecular precursor consists of methyl trifluoromethanesulfonate, $M_fM$, and said donor molecular precursor consists of DASI, whereby said DASI is volatized into DAS in the associated volatization step, and in said mixing step the DAS reacts with the volatized MM to form 4'-dimethylamino-4-methylstilbazolium trifluoromethanesulfonate ($DASM_f$) crystals on said substrate.

13. The method of claim 1, wherein said acceptor molecular precursor consists of MT, and said donor molecular precursor consists of 4'-dimethylamino-4-methylstilbazolium thiophenoxide, DASTh, whereby said DASTh is volatized into DAS in the associated volatization step, and in said mixing step the DAS reacts with the volatized MT to form 4'-dimethylamino-4-methystilbazolium tosylate (DAST) crystals on said substrate.

14. The method of claim 1, wherein said acceptor molecular precursor consists of MT, and said donor molecular precursor consists of 4'-methoxy-4-methylstilbazolium thiophenoxide, MeOSI, whereby said MeOSI is volatized into 4'-methoxy-4-methylstilbazole (MeOS) in the associated volatization step, and in said mixing step the MeOS reacts with the volatized MT to form MeOST crystals on said substrate.

15. The method of claim 1, wherein said acceptor molecular precursor consists of MT, and said donor molecular precursor consists of 4'-dimethylamino-4-ethylstilbazolium iodide, DAS(Et)I, whereby said DAS(Et) I is volatized into DAS in the associated volatization step, and in said mixing step the DAS reacts with the volatized MT to form DAST crystals on said substrate.

16. The method of claim 1, wherein said acceptor molecular precursor consists of MT, and said donor molecular precursor consists of 4'-dimethylamino-4-ethylstilbazolium hydroxide, DAS(Et)OH, whereby said DAS(Et)OH is volatized into DAS in the associated volatization step, and in said mixing step the DAS reacts with the volatized MT to form DAST crystals on said substrate.

17. The method of claim 1, wherein said acceptor molecular precursor consists of acetyl toluenesulfonate, AT, and said donor molecular precursor consists of DASI, whereby said DASI is volatized into DAS in the associated volatization step, and in said mixing step the DAS reacts with the volatized AT to form 4'-dimethylamino- 4-acetylstilbazolium tosylate (DAAST) crystals on said substrate.

18. The method of claim 1, wherein said acceptor molecular precursor consists of methyl trifluoroacetate, $MA_f$, which is introduced through a bubbler which is cooled, and said donor molecular precursor consists of DASI, whereby said DASI is volatized into DAS in the associated volatization step, and in said mixing step the DAS reacts with the volatized $MA_f$ to form 4'-dimethylamino-4-methylstilbazolium trifluoroacetate ($DASA_f$) crystals on said substrate.

19. The method of claim 2, wherein the volatization step for said acceptor molecular precursor further includes the step of forming the associated said chamber from a first bubbler immersed in a temperature controlled oil bath, with said acceptor molecular precursor being loaded into said first bubbler, and the associated said transporting step includes bubbling said inert gas therethrough for carrying volatized acceptor molecular precursor into said reaction zone of said reactor.

20. The method of claim 19, wherein the volatization step for said donor molecular precursor further includes the step of forming the associated said chamber by steps including:

placing a crucible loaded with said donor molecular precursor into said reactor at a position upstream of said reaction zone;

heating the portion of said reactor surrounding the area where said crucible is located for volatizing said donor molecular precursor; and passing said inert gas over said crucible for carrying volatized said donor molecular precursor into said reaction zone.

21. The method of claim 19, wherein the volatization step for said donor molecular precursor further includes the step of forming the associated said chamber from a second bubbler immersed in a temperature controlled oil bath, with said donor molecular precursor being loaded into said second bubbler, and the associated said transporting step includes bubbling said inert gas therethrough for carrying volatized donor molecular precursor into said reaction zone of said reactor.

22. The method of claim 2, wherein said acceptor molecular precursor consists of MT, and said donor molecular precursor consists of DASI, whereby said DASI is volatized into DAS in the associated volatization step, and in said mixing step the DAS reacts with the volatized MT to form a thin film of DAST crystals on said substrate, said method further including the steps of:

maintaining the temperature in said reaction zone to be within a range from 162° C. to 166° C.;

maintaining said first heated chamber within a temperature range of 248° C. to 258° C.;

maintaining said second heated chamber at a temperature of about 65° C.;

maintaining the flow rate of said inert gas at 15 cm$^3$/min for transporting said volatized MT into said reaction zone; and maintaining the flow rate of said inert gas at 400 cm$^3$/min for transporting said volatized DASI (DAS vapor) into said reaction zone.

23. A method for growing on a substrate in a reaction zone of a reactor an optically nonlinear thin film of an organic salt, comprising the steps of:

volatizing an acceptor molecular precursor, said acceptor molecular precursor being selected from the group consisting of an oxidizing agent, an electrophile, and an acid, respectively;

volatizing a donor molecular precursor, said donor molecular precursor being selected from the group consisting of a reducing agent, a nucleophile, and a base, respectively;

individually transporting the volatized donor molecular precursor and acceptor molecular precursor, respectively, into said reaction zone; and controlling the temperature of said reaction zone and substrate for maintaining a temperature supportive of sustaining a chemical reaction between the volatized donor and acceptor molecular precursors, for causing said organic salt to be deposited as a desired film upon said substrate.

24. The method of claim 23, further including the step of:

isolating said volatized donor and acceptor molecular precursors from one another in areas outside of said reaction zone.

25. The method of claim 23, wherein said organic salt consists of DAST, said acceptor molecular precursor consists of MT, and said donor molecular precursor consists of DASI.

26. The method of claim 25, wherein said MT is volatized by heating it to about 65° C., and said DASI is volatized by heating it to a temperature within a range of 248° C. to 258° C.

27. The method of claim 26, wherein in said transporting step an inert gas is used to transport said volatized MT or MT vapor at a flow rate of 15 cm$^3$/min into said reaction zone, and said volatized DASI or DAS vapor at a flow rate of 400 cm$^3$/min into said reaction zone.

28. The method of claim 27, wherein said inert gas consists of nitrogen (N$_2$).

29. A method for growing optically nonlinear thin films of a desired multi-component organic material on a substrate positioned in a reaction zone of a reactor, comprising the steps of:

volatizing at least one donor molecular precursor of the desired organic material in an individual chamber, said donor molecular precursor being selected from the group consisting of a reducing agent, nucleoopile, and a base, respectively;

volatizing at least one acceptor molecular precursor of said desired organic material in an individual chamber, said acceptor precursor being selected from the group consisting of an oxidizing agent, an electrophile, and an acid, respectively;

transporting the volatized donor and acceptor molecular precursors into said reaction zone of said reactor; and reacting said volatized donor and acceptor molecular precursors in a manner causing the growth of the desired thin film on said substrate.

30. The method of claim 29, wherein the two successive transporting steps each include using an inert gas to carry the respective volatized precursor into the reaction zone of said reactor.

31. The method of claim 30, wherein the inert gas consists of nitrogen (N$_2$).

32. The method of claim 30, wherein the inert gas consists of argon.

33. The method of claim 29, wherein said joining step further includes the step of controlling the temperature of said reaction zone of said reactor to maintain a temperature therein for optimizing the characteristics of the thin film formed on said substrate.

34. The method of claim 30, wherein said joining step further includes the step of controlling the temperature of said reaction zone of said reactor to maintain a temperature therein for optimizing the characteristics of the thin film formed on said substrate.

* * * * *